(12) United States Patent
Kitabayashi

(10) Patent No.: US 9,331,164 B2
(45) Date of Patent: May 3, 2016

(54) SILICON CARBIDE SEMICONDUCTOR DEVICE

(71) Applicant: Sumitomo Electric Industries, Ltd., Osaka-shi (JP)

(72) Inventor: Hiroyuki Kitabayashi, Osaka (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/794,581

(22) Filed: Jul. 8, 2015

(65) Prior Publication Data
US 2016/0056257 A1 Feb. 25, 2016

(30) Foreign Application Priority Data

Aug. 20, 2014 (JP) .................... 2014-167525

(51) Int. Cl.
| | | |
|---|---|---|
| H01L 29/78 | (2006.01) | |
| H01L 29/45 | (2006.01) | |
| H01L 29/16 | (2006.01) | |
| H01L 29/417 | (2006.01) | |

(52) U.S. Cl.
CPC ............ *H01L 29/45* (2013.01); *H01L 29/1608* (2013.01); *H01L 29/41741* (2013.01); *H01L 29/7827* (2013.01)

(58) Field of Classification Search
None
See application file for complete search history.

(56) References Cited

U.S. PATENT DOCUMENTS

| | | | | |
|---|---|---|---|---|
| 6,599,644 B1 * | 7/2003 | Zekentes | ............. | H01L 21/0485 257/750 |
| 6,759,683 B1 * | 7/2004 | Cole | .................. | H01L 21/0485 257/198 |
| 6,815,323 B1 * | 11/2004 | Lu | ........................ | H01L 21/0485 257/77 |
| 7,547,578 B2 | 6/2009 | Agarwal et al. | | |
| 7,875,545 B2 * | 1/2011 | Ward, III | ............ | H01L 21/0485 257/744 |
| 9,105,709 B2 * | 8/2015 | Tsuchiya | ............ | H01L 29/7394 |
| 9,117,681 B2 * | 8/2015 | Kawada | .............. | H01L 21/0485 |
| 2011/0207321 A1 | 8/2011 | Fujiwara et al. | | |

FOREIGN PATENT DOCUMENTS

JP 2011-171551 A 9/2011

OTHER PUBLICATIONS

Calcagno et al., "Effects of annealing temperature on the degree of inhomogeneity of nickel-silicide/SiC Schottky barrier," Journal of Applied Physics 98, pp. 023713-1 to 023713-6 (2005).
Kurimoto et al., "Raman study on the Ni/SiC interface reaction," Journal of Applied Physics 91, pp. 10215-10217, Jun. 15, 2002.

* cited by examiner

*Primary Examiner* — Benjamin Sandvik
(74) *Attorney, Agent, or Firm* — Venable LLP; Michael A. Santori

(57) ABSTRACT

A silicon carbide semiconductor device includes: a silicon carbide semiconductor layer; and an electrode layer in contact with the silicon carbide semiconductor layer. In a case where the electrode layer is equally divided into two in a thickness direction in one cross section of the electrode layer in the thickness direction to obtain a first region facing the silicon carbide semiconductor layer and a second region opposite to the silicon carbide semiconductor layer, an area of a carbon portion containing the carbon in the first region is wider than an area of the carbon portion in the second region. At an interface region located up to 300 nm from an interface between the silicon carbide semiconductor layer and the electrode layer, the carbon portion includes a plurality of portions disposed with a space interposed therebetween, and a ratio of area occupied by the carbon portion is not more than 40%.

3 Claims, 13 Drawing Sheets

SILICON CARBIDE SEMICONDUCTOR DEVICE

BACKGROUND OF THE INVENTION

1. Field of the Invention

The present disclosure relates to a silicon carbide semiconductor device.

2. Description of the Background Art

U.S. Pat. No. 7,547,578 discloses a backside electrode is formed on a grinded surface. Japanese Patent Laying-Open No. 2011-171551 discloses a backside electrode mainly composed of nickel (Ni).

It is suggested that carbon (C) in the SiC is diffused in the electrode (see L. Calcagno et al., "Effects of annealing temperature on the degree of inhomogeneity of nickel-silicide/SiC Schottky barrier" Journal of Applied Physics 98, 023713 (2005); doi: 10.1063/1.1978969, and E. Kurimoto et al., "Raman study on the Ni/SiC interface reaction" Journal of Applied Physics 91, 10215 (2002); doi: 10.1063/1.1473226).

SUMMARY OF THE INVENTION

A silicon carbide semiconductor device according to one embodiment of the present disclosure includes: a silicon carbide semiconductor layer; and an electrode layer in contact with the silicon carbide semiconductor layer. At least a portion of the electrode layer contains carbon. In a case where the electrode layer is equally divided into two in a thickness direction in one cross section of the electrode layer in the thickness direction to obtain a first region facing the silicon carbide semiconductor layer and a second region opposite to the silicon carbide semiconductor layer, an area of a carbon portion containing the carbon in the first region is wider than an area of the carbon portion in the second region. In the one cross section of the electrode layer in the thickness direction, at an interface region located up to 300 nm from an interface between the silicon carbide semiconductor layer and the electrode layer, the carbon portion includes a plurality of portions disposed with a space interposed therebetween and a ratio of area occupied by the carbon portion is not more than 40%.

DETAILED DESCRIPTION OF THE INVENTION

Figure 1:
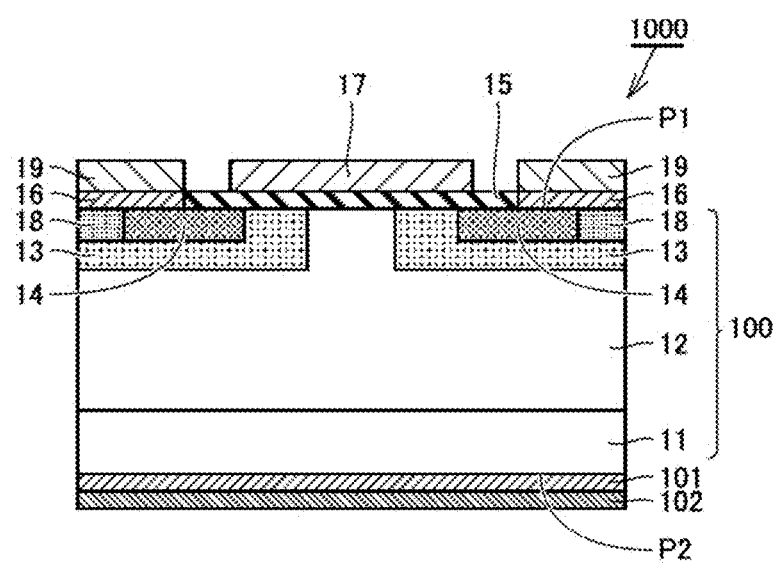
FIG. 1 is a schematic cross sectional view showing one example of a configuration of a silicon carbide semiconductor device according to one embodiment of the present disclosure.

U.S. Pat. No. 7,547,578 and Japanese Patent Laying-Open No. 2011-171551 disclose laser annealing as means for bringing the backside electrode and the SiC substrate into ohmic contact with each other. Furthermore, these documents disclose laser irradiation condition, temperature condition, and the like suitable therefor.

However, absorption of energy in the laser applied surface is changed every time due to a difference in pretreatment condition before the electrode formation, a difference in unevenness in laser applied surface, or a difference electrode formation condition or the like. Further, the laser annealing provides local heating for a short period of time as compared with normal lamp annealing or the like, so that it is not easy to measure the temperature of the heated portion precisely. Therefore, only by simply defining these conditions, it is difficult to form an ohmic electrode having a low resistance with good reproducibility by means of the laser annealing.

L. Calcagno et al., suggests that during ohmic annealing, a metal element (for example, Ni) of the electrode reacts with SiC to form silicide and C is separated from SiC and is diffused in the electrode. Further, E. Kurimoto et al., reports that the diffused C forms a cluster (hereinafter, also referred to as "carbon cluster" or "C cluster").

However, the present inventor has fully examined an electrode interface after laser annealing and found that with the laser annealing, C separated from SiC is not diffused in the electrode and is likely to remain at an interface between the SiC substrate and the electrode and small C clusters are aggregated into a layer at the interface, thus resulting in an increased contact resistance.

In view of such a current circumstance, it is an object to provide a silicon carbide semiconductor device allowing for a low contact resistance between a silicon carbide semiconductor layer and an ohmic electrode.

Description of Embodiments of the Present Disclosure

First, embodiments of the present disclosure are listed and described. In the description below, the same or corresponding elements are given the same reference characters and are not described repeatedly.

[1] A silicon carbide semiconductor device according to one embodiment of the present disclosure includes: a silicon carbide semiconductor layer 100; and an electrode layer 101 in contact with silicon carbide semiconductor layer 100. At least a portion of electrode layer 101 contains carbon. In a case where electrode layer 101 is equally divided into two in a thickness direction in one cross section of electrode layer 101 in the thickness direction to obtain a first region r1 facing silicon carbide semiconductor layer 100 and a second region r2 opposite to silicon carbide semiconductor layer 100, an area of a carbon portion 2 containing the carbon in first region r1 is wider than an area of carbon portion 2 in second region r2. In the one cross section of electrode layer 101 in the thickness direction, at an interface region IR located up to 300 nm from an interface between silicon carbide semiconductor layer 100 and electrode layer 101, carbon portion 2 includes a plurality of portions disposed with a space interposed therebetween, and a ratio of area occupied by carbon portion 2 is not more than 40%.

The carbon portion represents a region composed of carbon and having an area that can be measured in the one cross section of the electrode layer in the thickness direction.

In the description above, carbon portion 2 is mostly distributed on the SiC semiconductor layer 100 side in the one cross section of electrode layer 101 in the thickness direction. However, carbon portion 2 includes the plurality of portions disposed with a space interposed therebetween. That is, the carbon portion is diffused without being aggregated into a layer. Accordingly, via carbon portion 2, electrode layer 101 and the SiC semiconductor layer 100 can be in ohmic contact with each other.

When viewing the present disclosure from another perspective, the silicon carbide semiconductor device includes: silicon carbide semiconductor layer 100; and electrode layer 101 in ohmic contact with silicon carbide semiconductor layer 100. In the silicon carbide semiconductor device, carbon clusters 1 may be contained in electrode layer 101 at interface region IR located up to 300 nm from the interface between silicon carbide semiconductor layer 100 and electrode layer 101. A ratio of area occupied by carbon clusters 1 in interface region IR may be not less than 10% and not more than 40%.

In the silicon carbide semiconductor device described above, C separated from SiC is contained in electrode layer 101 as C clusters 1 rather than an aggregate in the form of a layer. Further, in the cross section of electrode layer 101 in the thickness direction, the ratio of area occupied by C clusters 1 is not less than 10% and not more than 40% in interface region IR located up to 300 nm from the interface between SiC semiconductor layer 100 and electrode layer 101.

Here, the "carbon (C) clusters" refer to a carbon portion in the form of clusters. A C cluster is an aggregate constituted of about 100 or more carbon atoms and having an aspect ratio (longer diameter/shorter diameter) of not less than 1 and not more than 5 in the cross section of electrode layer 101 in the thickness direction.

It can be recognized that the ratio of area occupied by C clusters 1 is an index indicating a degree of C clusters 1 diffused in electrode layer 101. According to research by the present inventor, when the ratio of area is less than 10%, C clusters 1 are diffused insufficiently, are formed into an aggregate in the form of a layer at the interface between SiC semiconductor layer 100 and electrode layer 101, and are segregated, whereby the ohmic contact between SiC semiconductor layer 100 and electrode layer 101 may be hindered. Moreover, when the ratio of area is more than 40%, C clusters 1 serving as a resistance component are excessively distributed in electrode layer 101, thereby increasing electric resistance of electrode layer 101. For this reason, in the silicon carbide semiconductor device described above, the ratio of area occupied by C clusters 1 is set at not more than 40% in interface region IR.

Here, the "ratio of area occupied by C clusters 1" is found in accordance with the following procedures (a) to (d). Also, "the ratio of area occupied by the carbon portion" is found in the same manner.

(a) First, samples (portions to be observed) for measurement are acquired from the silicon carbide semiconductor device. In doing so, the samples can be acquired from any locations but are desirably acquired from selected five points at least including the following three points: a central portion of electrode layer 101 when viewed in a plan view; and end portions thereof facing each other with the central portion being interposed therebetween. Here, the expression "when viewed in a plan view" is intended to mean a field of view when viewing the main surface of electrode layer 101 in the normal direction thereof.

(b) For acquiring the samples, a micro Sampling® method is suitable. Namely, using an FIB (Focused Ion Beam) apparatus, the samples are obtained by processing the circumferences of the portions to serve as the samples, attaching probes onto the portions, and cutting the bottom portions of the portions. Then, the samples are acquired together with the probes, the probes are separated by the FIB, and then the samples are formed into thin pieces by the FIB.

(c) Next, in each of the samples thus acquired, an image of the interface between electrode layer 101 and SiC semiconductor layer 100 is captured using an STEM (Scanning Transmission Electron Microscope), thereby obtaining an HAADF (High-Angle Annular Dark-Field) image. On this occasion, an observation magnification of the STEM is about 100000× to 1000000×, for example.

(d) In the HAADF image, the brightness of each pixel is extracted with respect to interface region IR included in electrode layer 101 and located up to 300 nm from the interface between electrode layer 101 and SiC semiconductor layer 100, and the number of pixels for each extracted brightness is counted. The brightness thus obtained is converted into a relative value assuming that the maximum value of the brightness is 100, and a frequency distribution (see FIG. 5, for example) is obtained. In this frequency distribution, it is defined that pixels having a brightness equal to or less than the mean value (value with which the relative value of the brightness becomes 50) result from carbon, and the "ratio of area occupied by the carbon clusters" can be calculated in accordance with the following formula (I):

(Ratio of Area)=(the Number of Pixels for Carbon in Interface Region IR)/(the Number of All the Pixels in Interface Region IR)　　(I).

On this occasion, when the plurality of samples are acquired as described above, it is desirable to use arithmetic mean values thereof. It should be noted that when the thickness of electrode layer 101 is less than 300 nm, the whole of electrode layer 101 is regarded as interface region IR.

When viewing the present disclosure from still another perspective, the silicon carbide semiconductor device includes: silicon carbide semiconductor layer 100; and electrode layer 101 in ohmic contact with silicon carbide semiconductor layer 100. Electrode layer 101 includes a region R1 having first thickness T1 and a region R2 having second thickness T2 thinner than first thickness T1. In the silicon carbide semiconductor device, the carbon clusters 1 may be contained in region R2 having second thickness T2.

Region R1 having first thickness T1 and region R2 having second thickness T2 are formed when SiC semiconductor layer 100 and electrode layer 101 are brought into ohmic contact with each other by means of irradiation of pulsed laser. Namely, laser annealing by the pulsed laser causes unevenness in heating depending on pulse spacing, with the result that region R1 having first thickness T1 and region R2 having second thickness T2 are alternately formed in, for example, the scanning direction of the laser. As described above, when the laser is applied to generate C clusters 1 also in region R2 having such a thin thickness, the ohmic contact between SiC semiconductor layer 100 and electrode layer 101 is secured and the contact resistance becomes low and good.

Carbon cluster 1 preferably has a size of not less than 10 nm and not more than 100 nm. This is because when the size of C cluster 1 is less than 10 nm, an aggregate in the form of a layer is likely to be formed. Moreover, when the size of C cluster 1 is more than 100 nm and C cluster 1 is diffused to the vicinity of the surface of electrode layer 101 in cases where die bonding electrode layer 102 is formed on electrode layer 101, adhesion is presumably affected between electrode layer 101 and die bonding electrode layer 102. Therefore, the size of carbon cluster 1 is preferably not more than 100 nm.

Here, the expression "size of the carbon cluster" is intended to mean an unidirectional particle diameter ("Feret's diameter") of the C cluster in the above-mentioned HAADF image (cross section of electrode layer 101 in the thickness direction).

[2] Electrode layer 101 preferably contains nickel (Ni). This is because the electric resistance of electrode layer 101 can be accordingly reduced.

[3] Preferably, electrode layer 101 further contains silicon (Si), and in a total of the number of atoms of nickel and silicon in electrode layer 101, a ratio of the number of atoms of nickel is not less than 68 atomic % and not more than 75 atomic %.

With electrode layer 101 containing Si, C clusters 1 can be suppressed from being diffused into the surface layer of electrode layer 101. By containing Ni and Si at the above-mentioned composition ratio, the electric resistance of electrode layer 101 can be reduced further.

Details of Embodiment of the Present Invention

The following describes an embodiment of the present disclosure (hereinafter, referred to as "the present embodiment") in detail, but the present embodiment is not limited thereto.

[Silicon Carbide Semiconductor Device]

FIG. 1 is a schematic cross sectional view showing one example of a configuration of a silicon carbide (SiC) semiconductor device 1000 according to the present embodiment. SiC semiconductor device 1000 is a vertical type MOSFET (Metal Oxide Semiconductor Field Effect Transistor) having a planar structure. SiC semiconductor device 1000 includes a SiC semiconductor layer 100 having a first main surface P1 and a second main surface P2 located opposite to first main surface P1. SiC semiconductor layer 100 includes a single crystal layer 11 and an epitaxial layer 12. Single crystal layer 11 is made of SiC having a 4H type crystalline polymorphism, for example. Single crystal layer 11 and epitaxial layer 12 have, for example, n conductivity type.

Epitaxial layer 12 is a semiconductor layer epitaxially grown on single crystal layer 11 and has various impurity regions (a body region 13, an n+ region 14, a contact region 18). On epitaxial layer 12, a gate insulating film 15, a gate electrode 17, a source electrode 16, and a front-surface-side pad electrode 19 are formed.

Formed on second main surface P2 are: an electrode layer 101 (ohmic electrode) in ohmic contact with SiC semiconductor layer 100; and a die bonding electrode layer 102 formed on electrode layer 101. In SiC semiconductor device 1000, electrode layer 101 and die bonding electrode layer 102 serve as a drain electrode. Die bonding electrode layer 102 is composed of titanium (Ti), aluminum (Al), Ni, gold (Au), or the like, for example.

Figure 2:
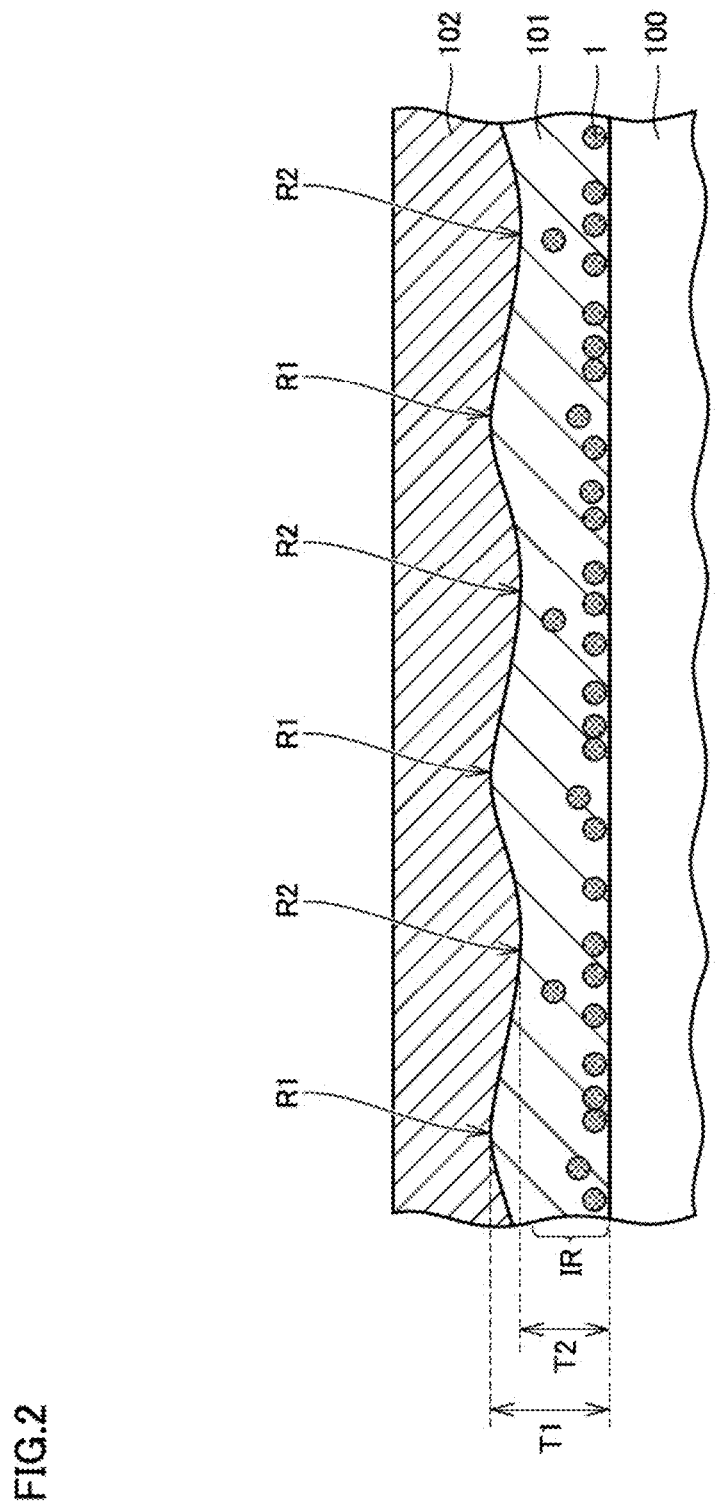
FIG. 2 is a schematic partial cross sectional view showing one example of a configuration of an interface between a silicon carbide semiconductor layer and an electrode layer.

FIG. 2 is a schematic partial cross sectional view showing one example of a configuration of an interface between SiC semiconductor layer 100 and electrode layer 101. SiC semiconductor layer 100 and electrode layer 101 are brought into ohmic contact with each other by laser annealing. Accordingly, electrode layer 101 is provided with regions R1 each having a first thickness T1 and regions R2 each having a second thickness T2 thinner than first thickness T1. They are formed due to unevenness in heating caused depending on pulse spacing of the laser. In this case, regions R1 and regions R2 are formed alternately in, for example, a scanning direction of the laser and both contain C clusters 1. When the laser is applied to generate C clusters 1 also in regions R2 having such a thin thickness, the ohmic contact is secured between SiC semiconductor layer 100 and electrode layer 101.

Here, first thickness T1 is not less than 300 nm, for example. Moreover, for example, first thickness T1 is not less than 1.2 times, preferably not less than 1.5 times, and particularly preferably not less than 2.0 times as large as second thickness T2.

When viewing from a different perspective, in SiC semiconductor device 1000, C clusters 1 are contained in an interface region IR located up to 300 nm from an interface between SiC semiconductor layer 100 and electrode layer 101 in electrode layer 101. In SiC semiconductor device 1000, a ratio of area occupied by C clusters 1 in interface region IR is not less than 10% and not more than 40%.

By thus defining the ratio of area occupied by C clusters 1, carbon separated from SiC is formed into clusters and distributed appropriately, thereby securing the ohmic contact between electrode layer 101 and SiC semiconductor layer 100.

Figure 3:
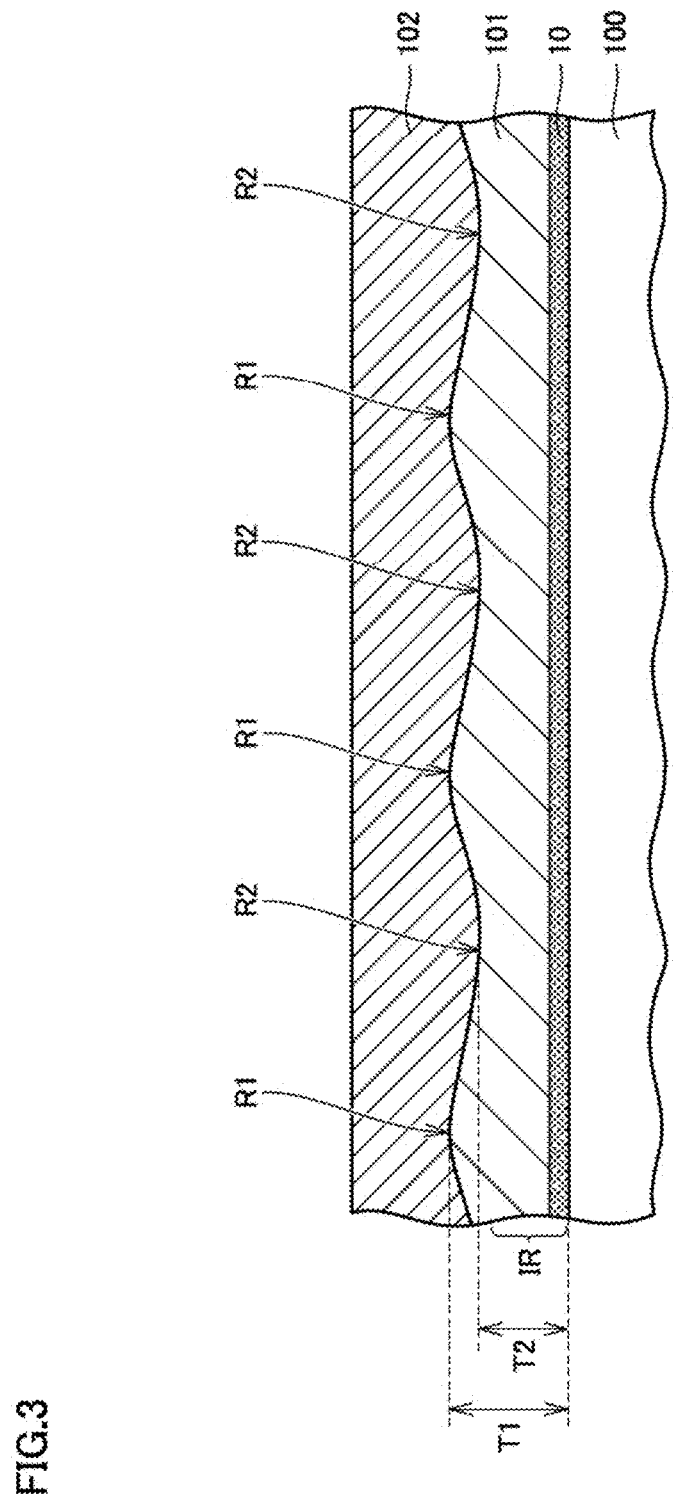
FIG. 3 is a schematic partial cross sectional view showing another example of the configuration of the interface between the silicon carbide semiconductor layer and the electrode layer.

FIG. 3 is a schematic cross sectional view showing a state of the electrode interface when the ratio of area occupied by C clusters 1 is less than 10%, for example. When the ratio of area occupied by C clusters 1 is less than 10%, small C clusters are aggregated into a carbon layer 10, thereby hindering the ohmic contact between SiC semiconductor layer 100 and electrode layer 101. On the other hand, when the ratio of area occupied by C clusters 1 becomes more than 40%, C clusters 1 are distributed in the whole of electrode layer 101, thus resulting in increased electric resistance of electrode layer 101. The ratio of area occupied by C clusters 1 is more preferably not less than 10% and not more than 30%, and is particularly preferably not less than 10% and not more than 20%.

The ratio of area occupied by C clusters 1 in interface region IR can be controlled in accordance with, for example, laser irradiation intensity during the laser annealing. However, absorption of energy is changed due to the differences in various conditions as described above, so that it is not appropriate to determine a condition for laser irradiation intensity indiscriminately. Hence, the condition is desirably found, for example, in the following manner: while changing the laser irradiation intensity in a range of about 1.0 J/cm$^2$ to 3.0 J/cm$^2$, the ratio of area occupied by C clusters 1 is measured to find a condition with which the value of not less than 10% and not more than 40% can be attained. In doing so, the wavelength of the laser is desirably set to be a wavelength corresponding to the band gap of SiC (wavelength of not more than 386 nm), such as a third harmonic wave (wavelength of 355 nm) of YAG laser or YVO$_4$ laser. Moreover, the pulse width of the laser may be appropriately adjusted in a range of not less than 10 ns and not more than 10 µs, for example.

The term "laser irradiation intensity" herein refers to an energy density at the time when a range of laser output up to the laser output reaching a value 1/e times as great as a peak value ("e" representing a Napier's constant) is defined as a laser irradiation range and it is assumed that 100% of laser energy is included within that irradiation range.

Each of the C clusters preferably has a size of not less than 10 nm and not more than 100 nm. Because C clusters each having a size of not less than 10 nm are unlikely to be formed into a layer, by performing annealing to attain C clusters each having a size of not less than 10 nm, the ohmic contact can be more securely attained between electrode layer 101 and SiC semiconductor layer 100.

On the other hand, when the size of each of the C clusters becomes more than 100 nm and such C clusters are diffused into the surface layer of electrode layer 101, adhesion may be affected between die bonding electrode layer 102 and electrode layer 101 both formed on the surface of electrode layer 101. Therefore, the size of the C cluster is preferably not more than 100 nm. The size of the C cluster is more preferably not less than 30 nm and is particularly preferably not less than 50 nm.

[Electrode Layer]

Electrode layer 101 may be formed by a sputtering method or vapor deposition method, for example. Electrode layer 101 has a thickness of about 50 to 1000 nm, for example.

An element of electrode layer 101 can be exemplified by Ni, Ti, tungsten (W), and molybdenum (Mo). Electrode layer 101 preferably contains Ni among them. Thus, electrical resistance can be lowered. Electrode layer 101 may be composed of a single element or of a plurality of elements. For example, electrode layer 101 may be composed of Ni and Si. With electrode layer 101 containing Si, the C clusters are suppressed from being diffused entirely in electrode layer 101, thereby reducing electric resistance. In electrode layer 101, Ni and Si may be in a state of a mixture, or may form an intermetallic compound such as nickel silicide (Ni$_2$Si).

When electrode layer 101 contains Ni and Si, the number of atoms of Ni is preferably not less than 68 atomic % and not more than 75 atomic % in the total number of atoms of Ni and Si. When the ratio of Ni is less than 68 atomic %, the electric resistance is likely to become high, whereas when the ratio is more than 75 atomic %, the amount of Si is insufficient to presumably result in failing to appropriately suppress the diffusion of C clusters. The ratio of Ni in the total of the number of atoms of Ni and Si is more preferably not less than 69 atomic % and not more than 74 atomic %, and is particularly preferably not less than 70 atomic % and not more than 73 atomic %. Such an atomic concentration can be measured, for example, with energy dispersive X-ray spectrometry (EDX), secondary ion mass spectrometry (SIMS), or the like. It should be noted that electrode layer 101 may contain an impurity inevitably introduced during formation.

[Evaluations]

The following describes the present embodiment more in detail with reference to Examples, but the present embodiment is not limited to these.

[Production of SiC Semiconductor Device]

SiC semiconductor devices (MOSFETs) were produced in below-described manners and a ratio of area occupied by C clusters in interface region IR and a diffusion state of the C clusters in the electrode layer were checked. Here, samples 1 and 2 correspond to Examples and samples 3 and 4 correspond to Comparative Examples.

[Sample 1]

SiC semiconductor layer 100 was prepared which had n type conductivity type and had first main surface P1 and second main surface P2 located opposite to first main surface P1. An element structure was formed at the first main surface P1 side, and then the sputtering method was employed to form electrode layer 101 containing Ni and Si on second main surface P2. On this occasion, electrode layer 101 had a thickness of 230 nm and was adjusted to have the following atomic ratio of Ni and Si: Ni:Si=72:28.

Next, laser annealing was provided to bring electrode layer 101 and SiC semiconductor layer 100 into ohmic contact with each other. On this occasion, the laser irradiation intensity was set at 1.8 J/cm$^2$. Furthermore, on electrode layer 101, a Ti layer, a Ni layer, and a Au layer were provided as die bonding electrode layer 102 by the sputtering method. In this way, the MOSFET according to sample 1 was obtained.

Figure 4:
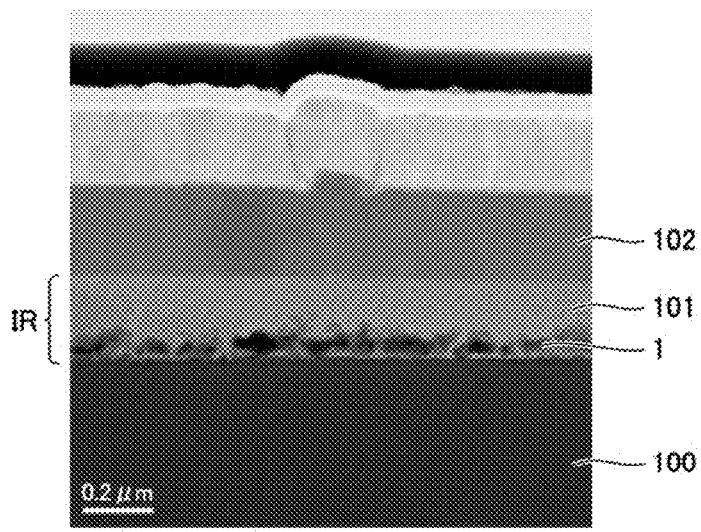
FIG. 4 shows an HAADF image showing an interface between a silicon carbide semiconductor layer and an electrode layer in a sample 1.
Figure 6:
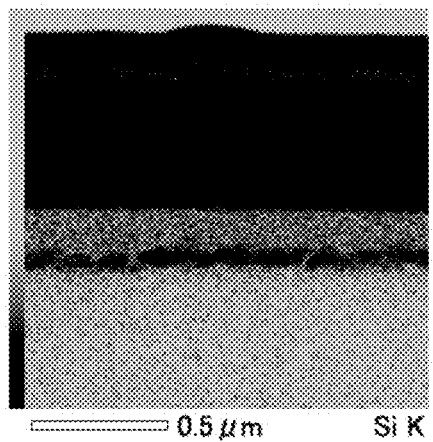
FIG. 6 shows an element mapping result for Si in FIG. 4.
Figure 7:
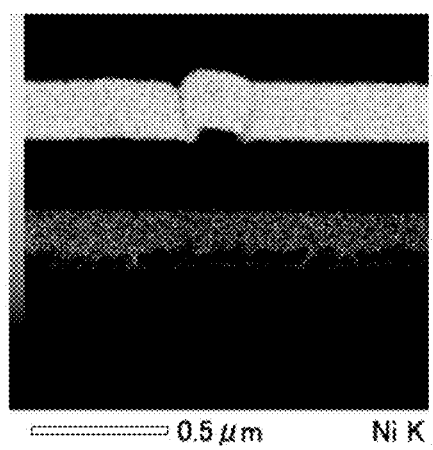
FIG. 7 shows an element mapping result for Ni in FIG. 4.
Figure 8:
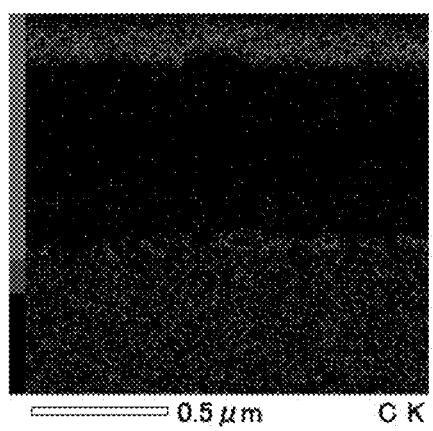
FIG. 8 shows an element mapping result for C in FIG. 4.

In accordance with the above-mentioned method, a sample for STEM was acquired, thereby obtaining an HAADF image shown in FIG. 4. Furthermore, in the same field of view, each of the elements, i.e., Si, Ni, and C was mapped. The results are shown in FIG. 6 (Si), FIG. 7 (Ni), and FIG. 8 (C), respectively. From FIG. 4 and FIG. 6 to FIG. 8, it is seen that C clusters 1 existed in interface region IR in sample 1.

Figure 5:
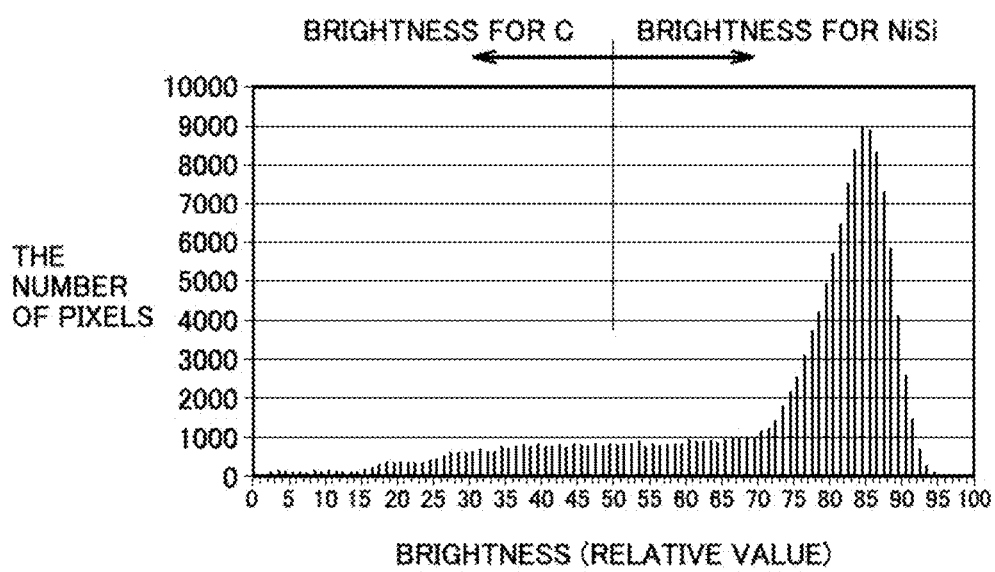
FIG. 5 shows a frequency distribution of brightness in the interface region of FIG. 4.

Next, in FIG. 4, the brightness of each pixel was extracted, the number of pixels for each extracted brightness was counted to obtain a frequency distribution shown in FIG. 5, and the ratio of area occupied by the C clusters in interface region IR was calculated in accordance with the above-mentioned method. The result is shown in Table 1.

TABLE 1

|  | Ratio of Area occupied by C Clusters in Interface Region (%) |
| --- | --- |
| Sample 1 | 16.5 |
| Sample 2 | 29.1 |
| Sample 3 | 42.6 |
| Sample 4 | 76.8 |

[Sample 2]

Sample 2 was obtained in the same manner as in sample 1 except that the thickness of electrode layer 101 was 800 nm and the laser irradiation intensity was 1.9 J/cm$^2$.

Figure 9:
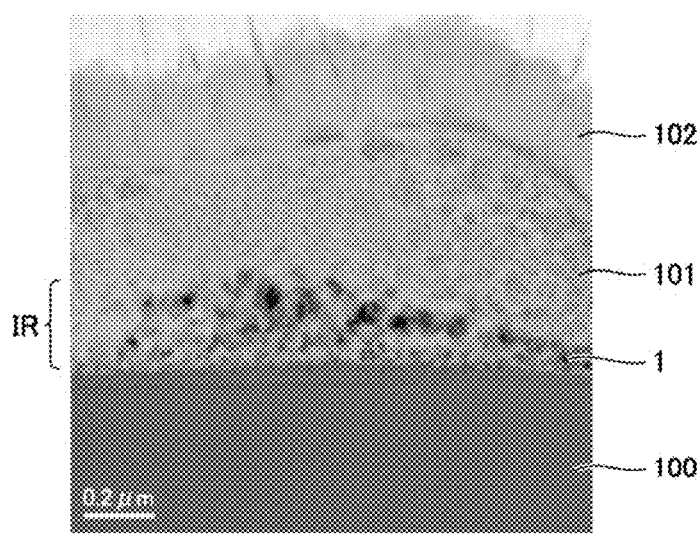
FIG. 9 shows an HAADF image showing an interface between a silicon carbide semiconductor layer and an electrode layer in a sample 2.
Figure 11:
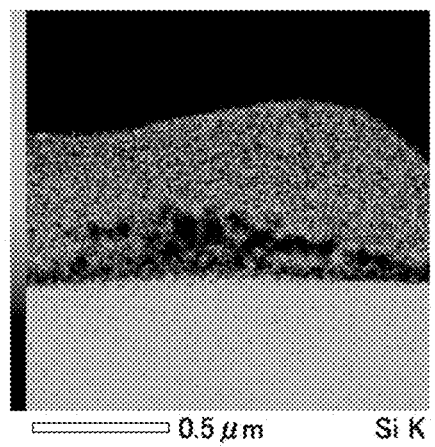
FIG. 11 shows an element mapping result for Si in FIG. 9.
Figure 12:
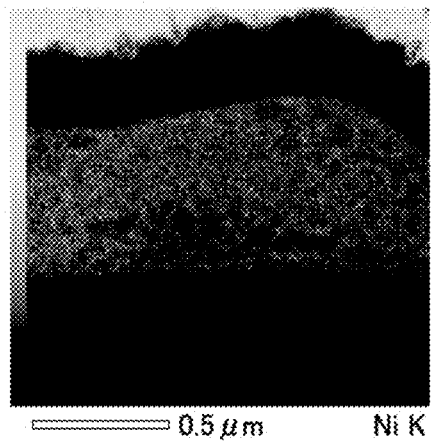
FIG. 12 shows an element mapping result for Ni in FIG. 9.
Figure 13:
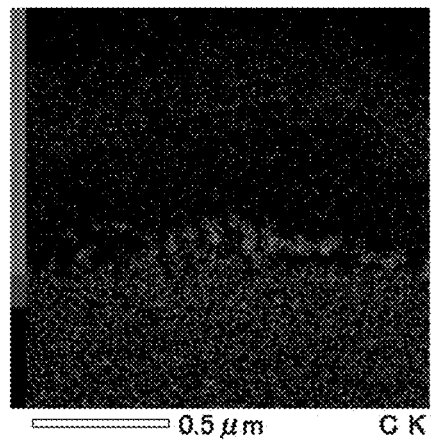
FIG. 13 shows an element mapping result for C in FIG. 9.

In accordance with the above-mentioned method, a sample for STEM was acquired, thereby obtaining an HAADF image shown in FIG. 9. Furthermore, in the same field of view, each of the elements, i.e., Si, Ni, and C was mapped. The results are shown in FIG. 11 (Si), FIG. 12 (Ni), and FIG. 13 (C), respectively. From FIG. 9 and FIG. 11 to FIG. 13, it is seen that C clusters 1 existed in interface region IR also in sample 2.

Figure 10:
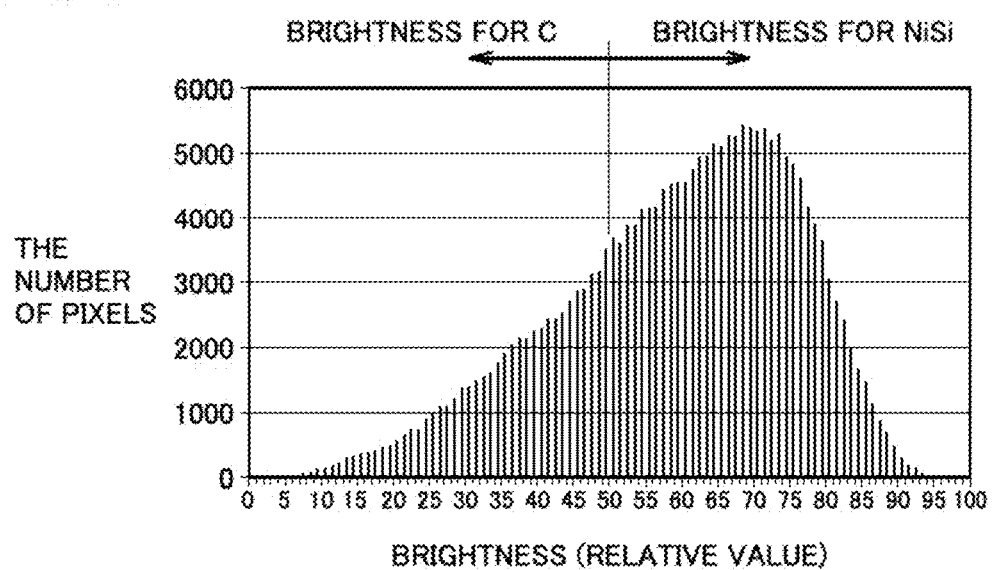
FIG. 10 shows a frequency distribution of brightness in the interface region of FIG. 9.

Next, in FIG. 9, the brightness of each pixel was extracted, the number of pixels for each extracted brightness was counted to obtain a frequency distribution shown in FIG. 10, and the ratio of area occupied by the C clusters in interface region IR was calculated in accordance with the above-mentioned method. The result is shown in Table 1.

[Sample 3]

Sample 3 was obtained in the same manner as in sample 1 except that the thickness of electrode layer 101 was 500 nm, the laser irradiation intensity was 2.0 J/cm², and a Ti layer, a Ni layer, and an Al layer were provided as die bonding electrode layer 102.

Figure 14:
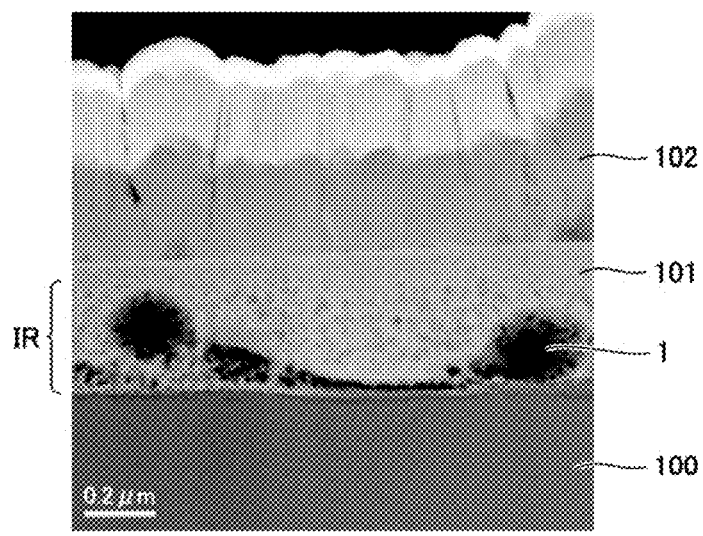
FIG. 14 shows an HAADF image showing an interface between a silicon carbide semiconductor layer and an electrode layer in a sample 3.
Figure 16:
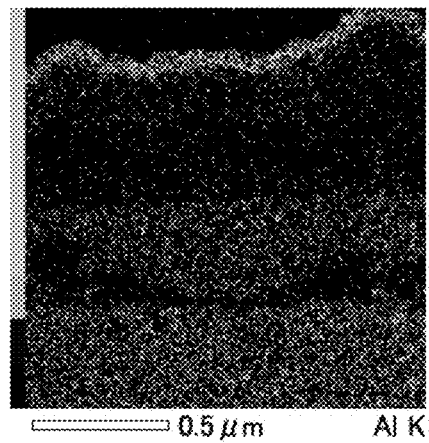
FIG. 16 shows an element mapping result for Al in FIG. 14.
Figure 17:
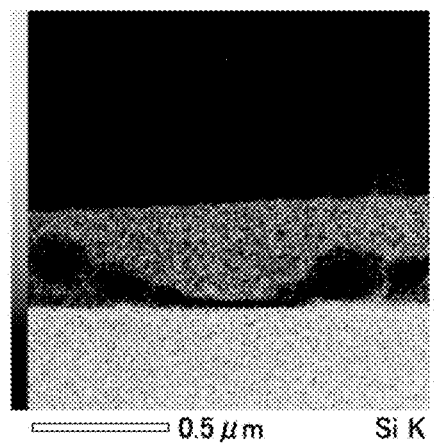
FIG. 17 shows an element mapping result for Si in FIG. 14.
Figure 18:
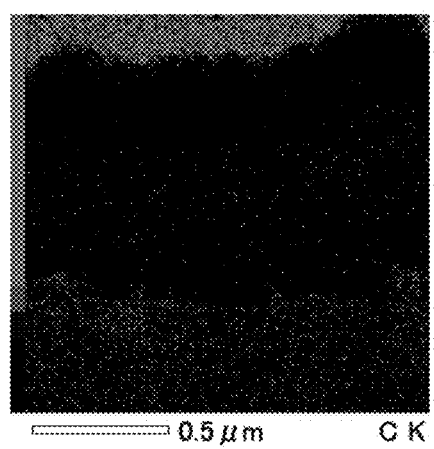
FIG. 18 shows an element mapping result for C in FIG. 14.

In accordance with the above-mentioned method, a sample for STEM was acquired, thereby obtaining an HAADF image shown in FIG. 14. Furthermore, in the same field of view, each of the elements, i.e., Al, Si, and C was mapped. The results are shown in FIG. 16 (Al), FIG. 17 (Si), and FIG. 18 (C), respectively. From FIG. 14 and FIG. 16 to FIG. 18, it is seen that C clusters 1 existed in interface region IR also in sample 3.

Figure 15:
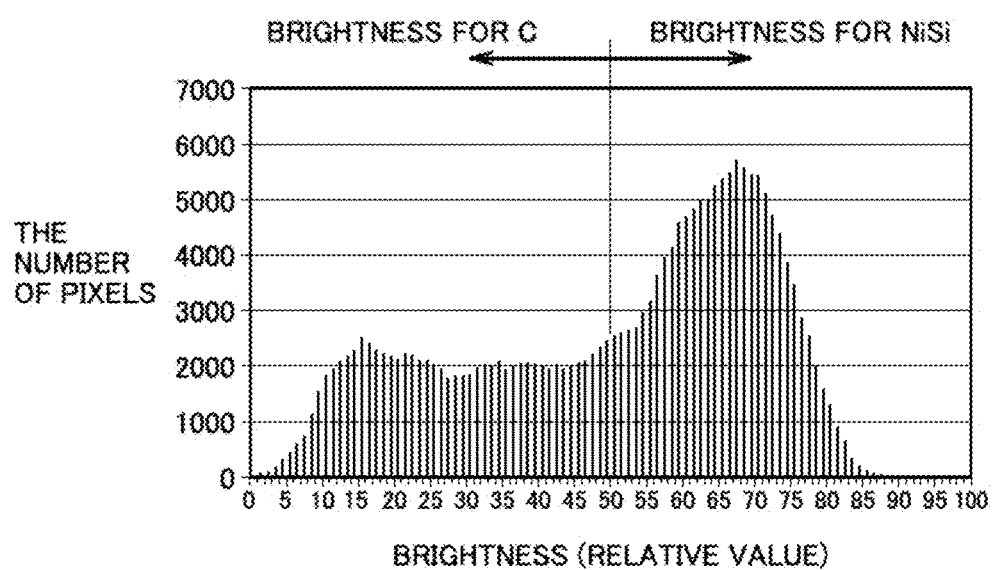
FIG. 15 shows a frequency distribution of brightness in the interface region of FIG. 14.

Next, in FIG. 14, the brightness of each pixel was extracted, the number of pixels for each extracted brightness was counted to obtain a frequency distribution shown in FIG. 15, and the ratio of area occupied by the C clusters in interface region IR was calculated in accordance with the above-mentioned method. The result is shown in Table 1.

[Sample 4]

Sample 4 was obtained in the same manner as in sample 1 except that the thickness of electrode layer 101 was 600 nm and the laser irradiation intensity was 21 J/cm².

Figure 19:
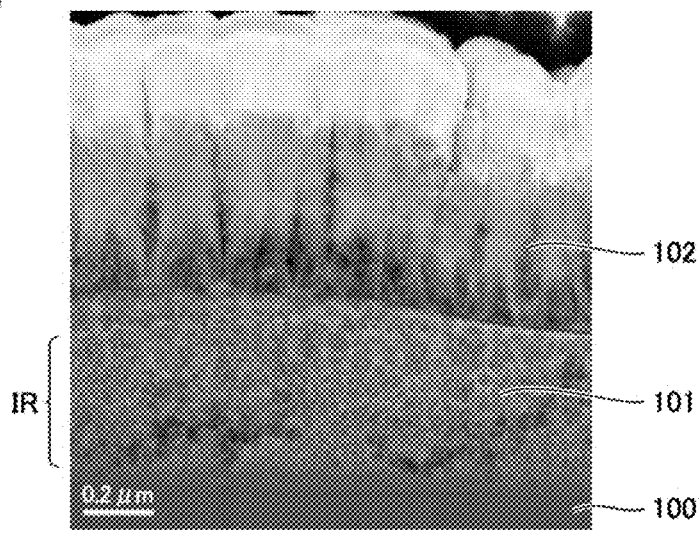
FIG. 19 shows an HAADF image showing an interface between a silicon carbide semiconductor layer and an electrode layer in a sample 4.
Figure 21:
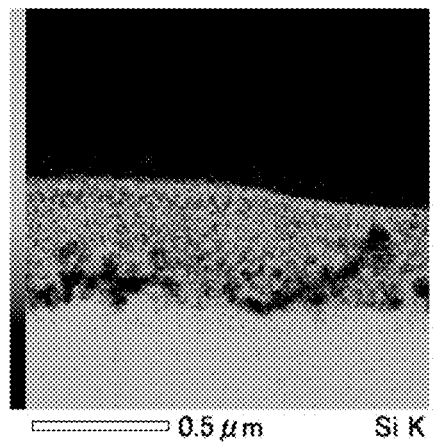
FIG. 21 shows an element mapping result for Si in FIG. 19.
Figure 22:
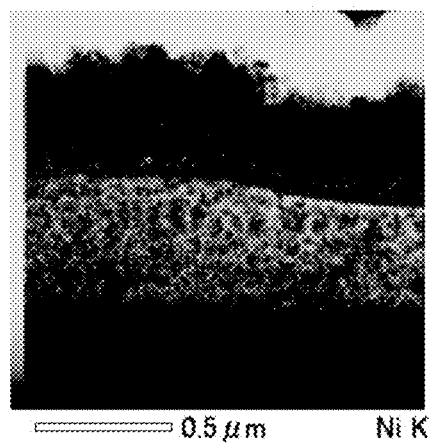
FIG. 22 shows an element mapping result for Ni in FIG. 19.
Figure 23:
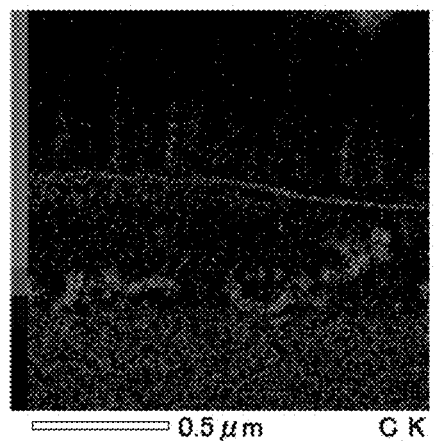
FIG. 23 shows an element mapping result for C in FIG. 19.

In accordance with the above-mentioned method, a sample for STEM was acquired, thereby obtaining an HAADF image shown in FIG. 19. Furthermore, in the same field of view, each of the elements, i.e., Si, Ni, and C was mapped. The results are shown in FIG. 21 (Si), FIG. 22 (Ni), and FIG. 23 (C), respectively. From FIG. 19 and FIG. 21 to FIG. 23, it is seen that small C clusters were diffused entirely in electrode layer 101 in sample 4.

Figure 20:
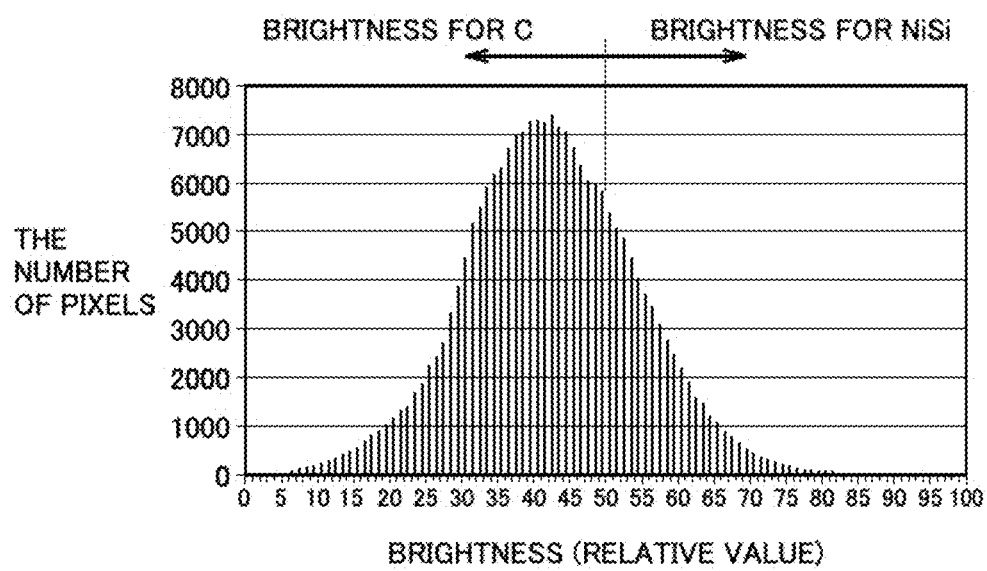
FIG. 20 shows a frequency distribution of brightness in the interface region of FIG. 19.

Next, in FIG. 19, the brightness of each pixel was extracted, the number of pixels for each extracted brightness was counted to obtain a frequency distribution shown in FIG. 20, and the ratio of area occupied by the C clusters in interface region IR was calculated in accordance with the above-mentioned method. The result is shown in Table 1.

[Results and Reviews]

From FIG. 4 (sample 1), FIG. 9 (sample 2), FIG. 14 (sample 3), and FIG. 19 (sample 4), it is seen that as the laser irradiation intensity is higher, a degree of diffusion of C clusters 1 is larger in electrode layer 101.

In FIG. 4 (sample 1), C clusters 1 are in the course of being aggregated near the interface, and if the diffusion of the C clusters is suppressed more than this, a carbon layer may be formed to hinder the ohmic contact. From Table 1, in sample 1, the ratio of area occupied by C clusters 1 is 16.5% in interface region IR. Therefore, the ratio of area is preferably not less than 10%, and is more preferably not less than 16%.

In FIG. 9 (sample 2), C clusters 1 of about 10 to 100 nm are generated. Moreover, in FIG. 9, C clusters 1 are diffused to such an extent that they are properly away from the interface between SiC semiconductor layer 100 and electrode layer 101 and are not spread entirely in electrode layer 101. Therefore, in sample 2, it is considered that good ohmic contact is obtained and increase in resistance of electrode layer 101 is also suppressed. As shown in Table 1, in sample 2, the ratio of area occupied by C clusters 1 is 29.1% (not less than 10% and not more than 40%) in interface region IR.

Moreover, in FIG. 9 (sample 2), it can be confirmed that regions R1 each having first thickness T1 and regions R2 each having second thickness T2 thinner than first thickness T1 are formed by the laser annealing and C clusters 1 are included in region R2.

In FIG. 14 (sample 3), C clusters 1 are in a state of starting to be distributed in the whole of electrode layer 101, and therefore it is concerned that the electric resistance of electrode layer 101 is increased. From Table 1, in sample 3, the ratio of area occupied by C clusters 1 is 42.6% in interface region IR.

Moreover, in sample 3, C clusters each having a size of more than 100 nm are generated, and therefore it is concerned that adhesion is decreased between electrode layer 101 and die bonding electrode layer 102. Therefore, the size of each C cluster is preferably not more than 100 nm.

In FIG. 19 (sample 4), the size of each C cluster is small, but the C clusters are diffused entirely in electrode layer 101 and therefore it is strongly concerned that the electric resistance is increased. From Table 1, in sample 4, the ratio of area occupied by C clusters 1 in interface region IR is 76.8%, which is larger than that of sample 3. Therefore, in consideration of the results of samples 3 and 4, the ratio of area occupied by C clusters 1 in interface region IR should be not more than 40%.

As described above, the contact resistance between SiC semiconductor layer 100 and the ohmic electrode (electrode layer 101) is considered to be low in the silicon carbide semiconductor device including: SiC semiconductor layer 100; and electrode layer 101 in ohmic contact with SiC semiconductor layer 100, C clusters 1 being contained in interface region IR located up to 300 nm from the interface between SiC semiconductor layer 100 and electrode layer 101 in electrode layer 101, the ratio of area occupied by C clusters 1 being not less than 10% and not more than 40% in interface region IR.

Figure 24:
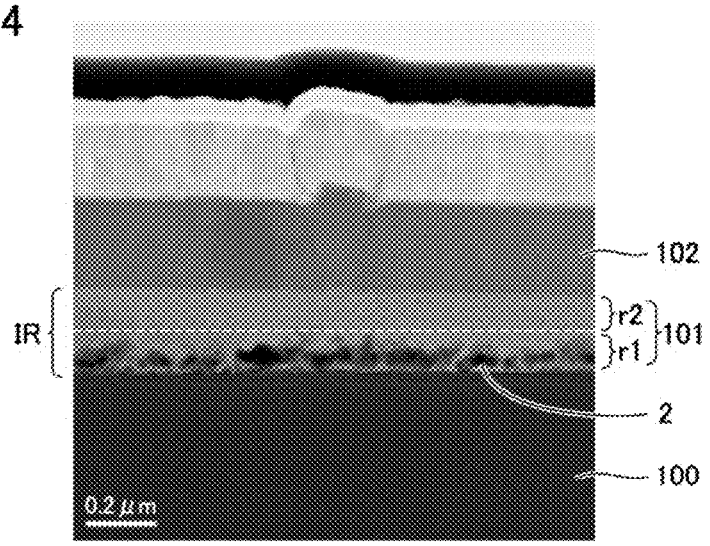
FIG. 24 is a schematic view for illustrating a configuration of sample 1.
Figure 25:
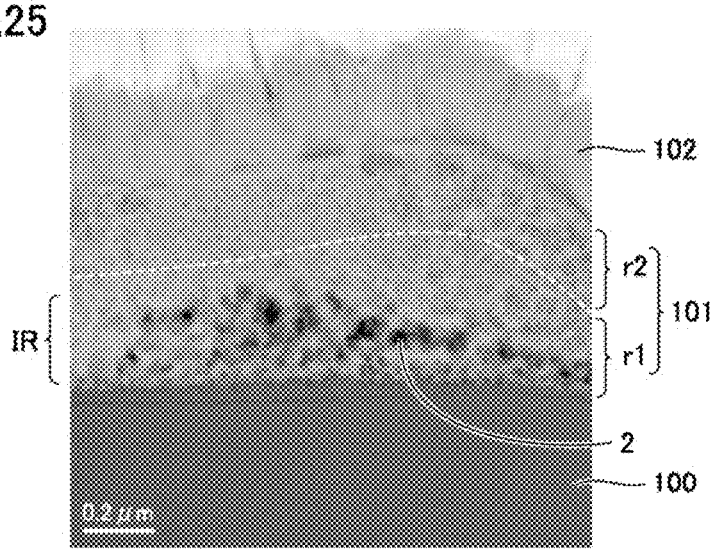
FIG. 25 is a schematic view for illustrating a configuration of sample 2.

FIG. 24 and FIG. 25 are schematic views for illustrating configurations of samples 1 and 2 described above. In FIG. 24 and FIG. 25, the C clusters are illustrated as a carbon portion 2. As described above, the C clusters refer to a carbon portion in the form of clusters. Therefore, a ratio of area occupied by carbon portion 2 is the same value as that of the above-mentioned ratio of area occupied by C clusters 1.

As shown in FIG. 24 and FIG. 25, in each of samples 1 and 2, in a case where electrode layer 101 is equally divided into two in a thickness direction in one cross section of electrode layer 101 in the thickness direction to obtain a first region r1 facing SiC semiconductor layer 100 and a second region r2 opposite to SiC semiconductor layer 100, an area of a carbon portion 2 containing the carbon in first region r1 is wider than an area of carbon portion 2 in second region r2. In the one cross section of electrode layer 101 in the thickness direction, at an interface region IR located up to 300 nm from an interface between SiC semiconductor layer 100 and electrode layer 101, carbon portion 2 includes a plurality of portions disposed with a space interposed therebetween. Moreover, a ratio of area occupied by carbon portion 2 is not more than 40% in the one cross section of electrode layer 101 in the thickness direction. As indicated by the above-mentioned evaluation, it is considered that samples 1 and 2 thus configured attain good ohmic contact.

Though the present embodiment has been described with reference to a MOSFET by way of example, the present embodiment is not limited thereto and can widely be applied to a silicon carbide semiconductor device such as an insulated gate bipolar transistor (IGBT) or a Schottky barrier diode (SBD). The silicon carbide semiconductor device may have not only a planar structure but also a trench structure.

Although the present disclosure has been described and illustrated in detail, it is clearly understood that the same is by way of illustration and example only and is not to be taken by way of limitation, the scope of the present invention being interpreted by the terms of the appended claims.

What is claimed is:

1. A silicon carbide semiconductor device comprising:
   a silicon carbide semiconductor layer; and
   an electrode layer in contact with said silicon carbide semiconductor layer,
   at least a portion of said electrode layer containing carbon,
   in a case where said electrode layer is equally divided into two in a thickness direction in one cross section of said electrode layer in the thickness direction to obtain a first region facing said silicon carbide semiconductor layer and a second region opposite to said silicon carbide semiconductor layer, an area of a carbon portion containing said carbon in said first region being wider than an area of said carbon portion in said second region, in said one cross section at an interface region located up to 300 nm from an interface between said silicon carbide semiconductor layer and said electrode layer, said carbon portion including a plurality of portions disposed with a space interposed therebetween, a ratio of area occupied by said carbon portion being not more than 40%.

2. The silicon carbide semiconductor device according to claim 1, wherein said electrode layer contains nickel.

3. The silicon carbide semiconductor device according to claim 2, wherein said electrode layer further contains silicon, and in a total of the number of atoms of nickel and silicon in said electrode layer, a ratio of the number of atoms of nickel is not less than 68 atomic % and not more than 75 atomic %.

* * * * *